(12) United States Patent
Horeth

(10) Patent No.: US 7,373,623 B2
(45) Date of Patent: May 13, 2008

(54) METHOD AND APPARATUS FOR LOCATING CIRCUIT DEVIATIONS

(75) Inventor: Stefan Horeth, Glonn (DE)

(73) Assignee: Onespin Solutions GmbH, Munich (DE)

( * ) Notice: Subject to any disclaimer, the term of this patent is extended or adjusted under 35 U.S.C. 154(b) by 199 days.

(21) Appl. No.: 11/177,203

(22) Filed: Jul. 7, 2005

(65) Prior Publication Data

US 2006/0064655 A1   Mar. 23, 2006

(30) Foreign Application Priority Data

Jul. 9, 2004   (DE) ................... 10 2004 033 339

(51) Int. Cl.
*G06F 17/50* (2006.01)
*G06F 11/00* (2006.01)
*G01R 31/28* (2006.01)

(52) U.S. Cl. .............. 716/4; 716/18; 703/16; 714/33; 714/37; 714/51; 714/724

(58) Field of Classification Search ........... 716/4, 716/18; 703/16; 714/33, 37, 51, 724
See application file for complete search history.

(56) References Cited

U.S. PATENT DOCUMENTS

| | | | | |
|---|---|---|---|---|
| 5,502,645 A * | 3/1996 | Guerra et al. ............ | 716/18 |
| 5,671,399 A | 9/1997 | Meier | |
| 5,801,958 A * | 9/1998 | Dangelo et al. .......... | 716/18 |
| 5,953,235 A * | 9/1999 | Gregory et al. .......... | 716/18 |
| 6,490,710 B1 | 12/2002 | Wada | |
| 6,532,584 B1 * | 3/2003 | Nishida et al. .......... | 716/18 |
| 6,704,914 B2 * | 3/2004 | Nishida et al. .......... | 716/8 |
| 6,816,828 B1 * | 11/2004 | Ikegami .................. | 703/15 |
| 6,907,599 B1 * | 6/2005 | Kashai et al. ........... | 717/137 |
| 6,925,628 B2 * | 8/2005 | Ogawa et al. ........... | 716/18 |
| 6,964,029 B2 * | 11/2005 | Poznanovic et al. ..... | 716/7 |
| 7,006,960 B2 * | 2/2006 | Schaumont et al. ...... | 703/15 |
| 7,120,879 B2 | 10/2006 | Gutberlet et al. | |
| 2003/0033039 A1 | 2/2003 | Gutberlet et al. | |
| 2004/0049747 A1 | 3/2004 | Yamasaki et al. | |

(Continued)

FOREIGN PATENT DOCUMENTS

DE   4423367 A1   7/1996

(Continued)

*Primary Examiner*—Phallaka Kik
(74) *Attorney, Agent, or Firm*—Brinks Hofer Gilson & Lione

(57) ABSTRACT

A system and method for locating circuit deviations or circuit faults in a circuit in respect of a reference circuit. The circuit and the reference circuit are respectively describable by signal-flow graphs, the signal-flow graphs being composed of a multiplicity of interconnected function blocks. The function blocks of the circuit are first assigned to corresponding function blocks of the reference circuit. There are then ascertained those function blocks of the circuit and of the reference circuit for which assignment has not been possible, and which have disposed upstream in the signal flow at least one function block for which assignment has been possible. The result is a boundary between an assigned and a non-assigned region of the circuit and the reference circuit, respectively. A representation of the circuit and reference circuit is preferably produced in which the regions corresponding to the non-assigned function blocks are highlighted.

17 Claims, 5 Drawing Sheets

U.S. PATENT DOCUMENTS

| | | | |
|---|---|---|---|
| 2004/0083443 A1* | 4/2004 | Ogawa et al. | 716/18 |
| 2004/0088666 A1* | 5/2004 | Poznanovic et al. | 716/7 |
| 2005/0166167 A1* | 7/2005 | Ivancic et al. | 716/5 |
| 2005/0204316 A1* | 9/2005 | Nebel et al. | 716/2 |
| 2007/0006112 A1* | 1/2007 | Gutberlet et al. | 716/18 |

FOREIGN PATENT DOCUMENTS

| | | |
|---|---|---|
| DE | 102 40 133 A1 | 3/2004 |
| JP | 07044583 A * | 2/1995 |
| JP | 2004164627 A * | 6/2004 |

* cited by examiner

METHOD AND APPARATUS FOR LOCATING CIRCUIT DEVIATIONS

PRIORITY CLAIM

This application claims priority to German Patent Application DE 10 2004 03333.9 filed Jul. 9, 2004, which is incorporated herein by reference.

TECHNICAL FIELD

The present invention relates to a method and to an apparatus for locating circuit deviations, wherein a circuit, particularly in the form of an application-specific integrated circuit, is compared with a reference circuit in order to locate in the circuit functional deviations in respect of the reference circuit.

BACKGROUND

In the development of so-called ASICs (Application-Specific Integrated Circuits), it is normally necessary to compare different version or optimization statuses of the circuit design with one another. Computer-aided methods, which compare a circuit with a reference circuit in respect of their functional equivalence, are known for this purpose. In this case, the circuit and the reference circuit are typically described by a circuit description language appropriate for computer-aided circuit design.

Such an equivalence comparison of circuits is performed particularly when it is to be checked whether a later version of the circuit design corresponds with an earlier version or the original version of the circuit design. In this way, it is possible to ensure that the circuit produced according to the final circuit design also has the functionality provided for according to the original circuit design.

If, on the other hand, a functional deviation between the circuit and the reference circuit is ascertained upon such an equivalence comparison of a circuit and a reference circuit, it is necessary to find and locate this functional deviation in the circuit design, in order that an appropriate correction can be made.

Known in this connection is the practice of locating the fault by means of a fault model. Such a fault model is normally based on a certain assumption concerning the nature of the fault (e.g., non-connected circuit networks or function blocks, additional inverters, etc.). Also known is the practice of using simulations to make probability statements concerning the fault site. A further approach is based on the ascertainment of internal equivalences of circuits. This means that individual circuit regions are in each case checked in pairs in respect of their equivalence. For this, however, it is first necessary to create possible pairings for such internal equivalences, an operation which can be performed, for example, on the basis of names used in the circuit description.

The previously described approaches for locating circuit deviations have problems, however, in that they require a large amount of effort and that, in some cases, it is not possible to state exactly the site of the deviation.

BRIEF SUMMARY

The present invention provides a method and an apparatus for locating circuit deviations, wherein the detection of circuit deviations is achieved with a high level of accuracy and with a small amount of effort.

The invention is based on, in particular, the following observations:

During circuit development, i.e., during the transition from an earlier to a later design of the circuit, signal dependence relationships are altered only insignificantly, or are altered only locally, by synthesis tools used during the creation of the circuit design, or during optimizations of the circuit design. In such cases, the signal dependence relationships include, in particular, the dependence of the behaviour observed at a signal output or the signal outputs of a function block of the circuit in respect of circuit inputs of the circuit or in respect of function blocks disposed upstream in the signal flow. In this case, function blocks are to be understood to be, for example, circuit networks, sequential logic systems, combinational or logic operators, and combinations of same.

Upon occurrence of a fault or a functional deviation in the circuit, there are performed or computed, at the function blocks disposed downstream from the fault site or deviation site in the signal flow, functions which are not present in the original, non-defective circuit, or which can easily be identified as defective upon additional consideration of the signal dependence relationships.

The method according to the invention and the corresponding apparatus according to the invention in this case relate to circuits which are respectively describable by signal-flow graphs comprising a multiplicity of function blocks. In this case, in respect of its inputs, a function block performs a certain function or computes a certain function which is expressed in the behaviour observed at the output or the outputs of the function block. Within the meaning of the application, such a function block may comprise one or more inputs and one or more outputs. In the signal-flow graphs, the function blocks are coupled to one another, in that an output of a function block which is upstream in the signal flow is connected to an input of a function block which is downstream in the signal flow. A circuit input is respectively coupled to an input of one of the function blocks, and a circuit output is respectively coupled to an output of one of the function blocks. A branched, network-type structure is thus obtained for the signal-flow graphs of the circuit.

The method according to the invention is based on a comparison of the circuit with a reference circuit, the circuit and the reference circuit being respectively describable by a signal-flow graph of the type described above. The circuit and the reference circuit may be, for example, circuit designs which have proceeded from the same original circuit design through optimizations or developments, or they may be a circuit design and the original circuit design, from which this circuit design has proceeded.

Provision is made, according to the invention, whereby function blocks of the circuit are assigned to corresponding function blocks of the reference circuit. In the case of a circuit deviation between the circuit and the reference circuit, however, it will not be possible, for the reasons explained above, to assign all function blocks of the circuit to corresponding function blocks of the reference circuit. There thus results a set of assigned function blocks of the circuit and of non-assigned function blocks of the circuit. In a further step, there are ascertained those function blocks of the circuit to which it has not been possible to assign any function block of the reference circuit, and which respectively have, disposed upstream in the signal-flow, a function block to which it has been possible to assign a function block of the reference circuit. In the ascertainment of the function blocks, it is preferably assumed that, in the case of a plurality of function blocks disposed upstream in the signal flow, it has been possible to assign all of these upstream function blocks.

The function blocks ascertained by the method according to the invention make it possible to locate the circuit deviations to be detected. The latter are in this case present in the function blocks themselves, i.e., in therein defectively formed logic gates or links, or in the links to the function blocks disposed upstream in the signal flow. In order also to permit detection of deviations occurring in function blocks which have no function blocks upstream in the signal flow, e.g. function blocks disposed immediately downstream from the circuit inputs, or function blocks in which the circuit deviation consists in all links to the function blocks upstream in the signal flow being broken or absent, it is preferred, according to the invention, to additionally ascertain also those function blocks of the circuit to which it has not been possible to assign any function block of the reference circuit, and which have no function block upstream in the signal flow.

Preferably, in the case of the method according to the invention, the signal-flow graph of the circuit is represented and a region corresponding to the non-assigned function blocks is highlighted in comparison with a region corresponding to the assigned function blocks. This can be effected in that, for example, the assigned function blocks and/or the links between the assigned function blocks are colour-marked. Alternatively, or in addition, it is possible to colour-mark the non-assigned function blocks and/or the links between the non-assigned function blocks. In this way, the assignment information between the circuit and the reference circuit can be represented graphically for a user of the method, e.g. a circuit developer. In such a representation, the boundary between regions of assigned function blocks and non-assigned function blocks of the circuit also becomes clearly evident, thereby enabling the deviations between the circuit and the reference circuit that are to be located to be optically located in a convenient manner.

According to the present invention, the assignment of function blocks of the circuit to respectively one corresponding function block of the function blocks of the reference circuit is preferably effected iteratively, on the basis of the set of already assigned function blocks or circuit inputs that are respectively disposed upstream in the signal flow relative to the assigned function blocks of the circuit and of the reference circuit, an assignment of the circuit inputs of the circuit to the circuit inputs of the reference circuit being predefined. This means that the assignment of the function blocks of the circuit to the function blocks of the reference circuit is effected on the basis of the elements of the circuit that are respectively upstream in the signal flow and have already been assigned.

In the assignment, the respective function that is performed or computed by the function blocks of the circuit and reference circuit that are to be assigned to one another is preferably taken into account as assignment information. In this case, the function of the function blocks can be defined, for each of the function blocks, in respect of its inputs. Preferably, however, the function of the function blocks is respectively defined in respect of the signal inputs of the circuit and of the reference circuit. The assignment is then preferably effected on the basis of the function of the function blocks in such as way that the function blocks of the circuit are respectively assigned to only one of the function blocks of the reference circuit, which function block performs the same function. In this case it is particularly advantageous if the function blocks of the circuit and of the reference circuit are classified with regard to the function which they perform in the circuit and in the reference circuit respectively. The classification, i.e., the assignment of the function blocks to a certain class that is determined by their function, makes it possible to simplify the process of assignment between the function blocks of the circuit and the function blocks of the reference circuit, since the respective functions of the function blocks do not have to be repeatedly ascertained.

An exact assignment between the function blocks of the circuit and the function blocks of the reference circuit can be achieved in the manner described above with a particularly small amount of effort. It is only necessary to predefine the assignment between the circuit inputs of the circuit and of the reference circuit, which assignment is usually available anyway or can be created with little effort.

The method according to the invention can be transferred to a further circuit description, particularly to a circuit description that differs from the signal-flow graph. In this case, elements of the corresponding representation, if they comprise at least one non-assigned function block, are highlighted in comparison with elements which do not comprise a non-assigned function block. The highlighting can again be effected, in a manner similar to that previously described, through colour-marking of the respective elements of the representation. In this case, the further circuit description may correspond, in particular, to a hierarchy level which is higher in respect of the signal-flow graph, the elements of the further circuit description consisting of higher-order circuit modules or circuit blocks which respectively comprise at least one of the function blocks. In this way, the result of the method according to the invention is available in different forms of representation of the circuit, and can thus be used for a multiplicity of different analyses or revisions of the circuit.

The method according to the invention is preferably executed symmetrically in respect of the circuit and the reference circuit. This means that the circuit and the reference circuit are processed in the same manner and by means of the same algorithms, and that the previously described procedural steps are also performed in the same way for the reference circuit. In this case, the corresponding procedural sequence for the reference circuit is obtained by exchanging the circuit and the reference circuit in the previously described procedural steps. In this way, the informative value of the method, according to the invention, for detecting circuit deviations is further increased. In particular, improvements are achieved with regard to locating of circuit deviations in the case of which there is absent from the circuit, in respect of the reference circuit, a portion which, with regard to its function, is independent of the remainder of the circuit. The symmetrical execution of the method in respect of the circuit and the reference circuit also requires only a small amount of additional effort since, in particular, the necessary information relating to assignment between function blocks of the circuit and function blocks of the reference circuit need only be ascertained once.

The present invention furthermore relates to an apparatus for locating circuit deviations. The apparatus is again based on the previously described circuit description as a signal-flow graph. The apparatus according to the invention comprises input means, for inputting circuit data which describe the circuit and the reference circuit, and data processing means, which are designed, through processing of the circuit data, to assign function blocks of the circuit to corresponding function blocks of the reference circuit, and to ascertain those function blocks of the circuit to which it has not been possible to assign any function block of the reference circuit, and which have, upstream in the signal flow, a function block to which it has been possible to assign a function block of the reference circuit. Moreover, the apparatus is preferably designed to execute the previously described method according to the invention.

The invention additionally relates to a computer program product comprising a program code which is of such design that, when it is used with a computer system, the method according to the invention is executed.

The present invention enables circuit deviations to be located with a high degree of accuracy and with little effort. In respect of accuracy, it is particularly advantageous that only those function blocks which perform the same function in the respective circuit are assigned to one another. Through the highlighting of the regions corresponding to the non-assigned function blocks, the invention provides the user with a good orientation in the circuit and in the reference circuit. In particular, an overview of the site of the circuit deviations, and the associated fault spread, can be obtained in a rapid and convenient manner. The function blocks ascertained according to the present invention enable the site of a deviation or fault to be located directly, since they include the deviation site or, in many cases, they themselves constitute the deviation site.

In addition, it has been found that the method according to the invention enables circuit deviations to be located with a small expenditure of time. In this case, the time expended for the detection of the circuit deviations typically corresponds approximately to the expenditure of time required for a conventional equivalence comparison of the circuit and reference circuit.

It has furthermore been found that the present invention is comparatively insensitive to incorrect information that may result, for example, from incorrect operation by the user. In particular, successful locating of the circuit deviations is still possible even if, for example, function blocks have been assigned, with regard to their function, to an incorrect class. Even in this case, it is possible to delimit the sites of the circuit deviations or faults, a more exact assignment of the function blocks to a class with regard to their function normally also permitting a more exact ascertainment of the circuit deviation sites.

The present invention is particularly suitable as a complement to an equivalence comparison of the circuit and reference circuit such as that known from the prior art. In this case, the circuit and the reference circuit would first be checked for equivalence with regard to their function and, if no equivalence of the circuit and reference circuit is found, the circuit deviations responsible for this non-equivalence would be found and located according to the present invention, or it is first attempted, using the method according to the invention, to locate circuit deviations and, if none are found, the equivalence comparison is performed.

BRIEF DESCRIPTION OF THE DRAWING

The present invention is explained more fully in the following with reference to the appended drawings, on the basis of a preferred exemplary embodiment.

DETAILED DESCRIPTION

The following description explains a method for locating circuit deviations of a circuit 10' in respect of a reference circuit 10. In the example described, the circuit 10' and the reference circuit 10 are based on a common original circuit design. In particular, the circuit 10' is a circuit design which has proceeded from the reference circuit 10 in the course of circuit development. In the case of such circuit designs belonging to different development stages, it is necessary for them to be equivalent in respect of their function.

Figure 1:
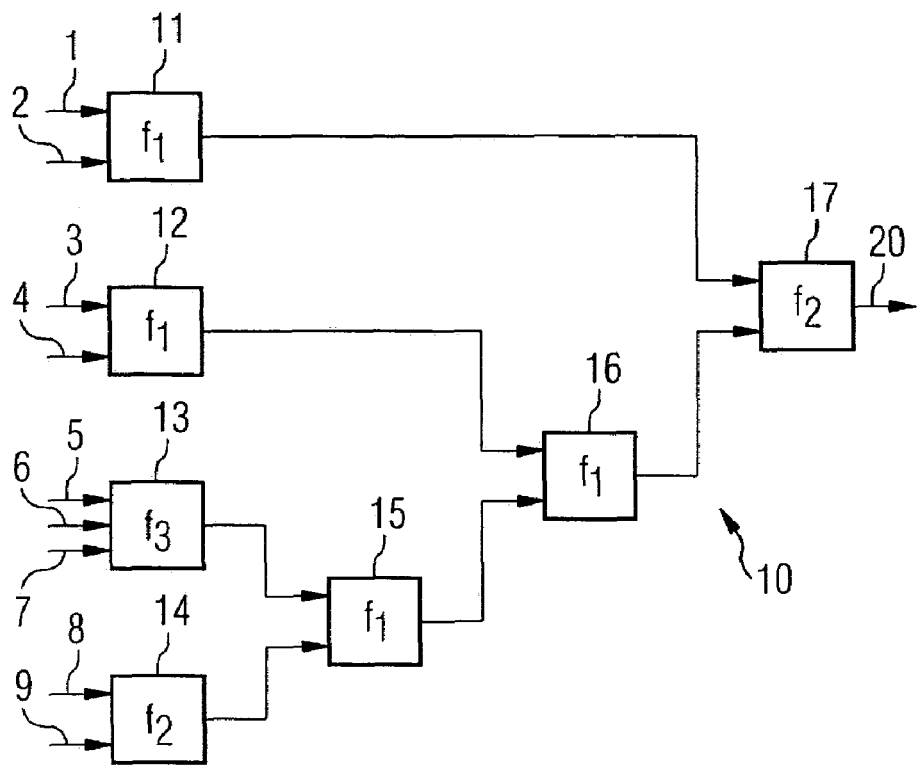
FIG. 1 shows a circuit and a reference circuit which are respectively described by a signal-flow graph.
Figure 1:
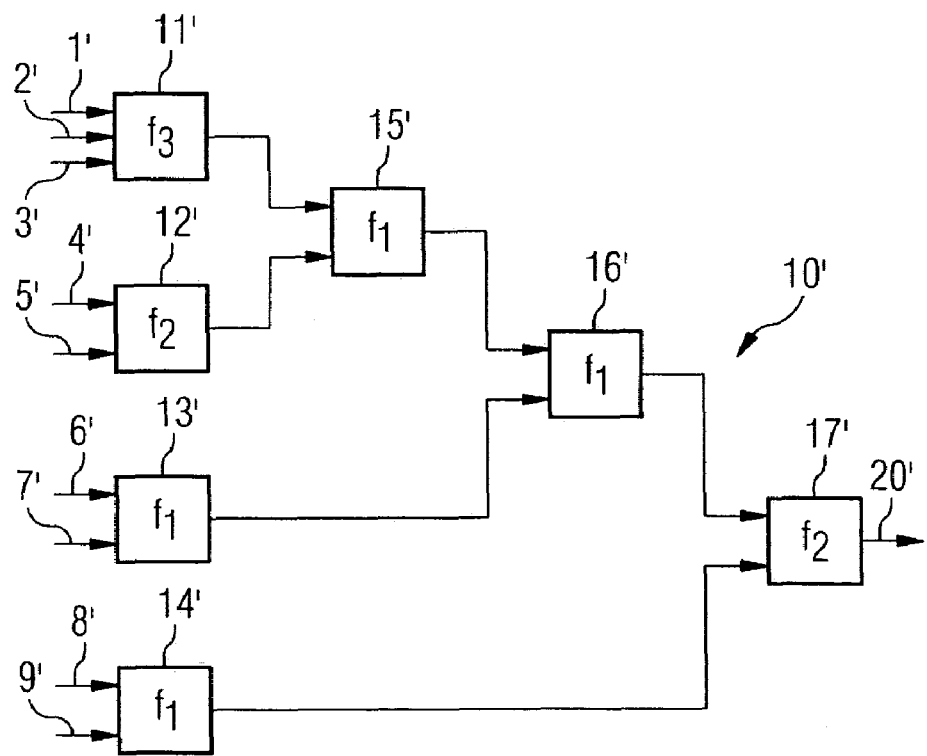

FIG. 1 shows a circuit 10' and a reference circuit 10 which are respectively represented in the form of a signal-flow graph. In this case, the circuit 10' and the reference circuit 10 each comprise function blocks 11'-17' and 11-17 respectively. In this case, the function blocks 11-17, 11'-17' respectively have a certain function, this being denoted by the identifier $f_1$, $f_2$ and $f_3$ respectively. These functions are defined, for each of the function blocks, by the behaviour of an output of the function block in respect of its inputs. In this case, for example, they may be simple logical links or, also, operations of a more complex composition. The function blocks may thus consist of simple logic gates or, also, of a linkage of a plurality of logic gates.

In the signal-flow graphs shown in FIG. 1, the function blocks 11-17, 11'-17' are coupled to one another, in that the output of a function block 11-17, 11'-17' disposed upstream in the signal flow is connected to respectively one of the inputs of a function block disposed downstream in the signal flow. Furthermore, there are function blocks 111'-17', 11-17 whose inputs are coupled to circuit inputs 1'-9' and 1-9 of the circuit 10' of the reference circuit respectively. An output of a function block 17', 17 disposed last in the signal flow is in each case coupled to a signal output 20', 20 of the circuit 10' and of the reference circuit respectively.

The circuit 10' and the reference circuit 10 of FIG. 1 are represented exemplarily in order to illustrate the method to be described, and it is to be understood that a multiplicity of other circuit arrangements are possible. In particular, in this connection there are no limitations whatsoever in respect of the number of inputs and outputs of the function blocks, so that, for example, a function block could also have a plurality of outputs. Furthermore, it is obviously also conceivable for a circuit arrangement to have a plurality of circuit outputs, in which case, however, it is usually possible to divide the circuit into signal-flow graphs, of the type shown in FIG. 1, having only one circuit output. In the case of such a division, overlaps typically occur between the circuit portions that respectively belong to a circuit output, because more complex circuits usually have circuit inputs which affect more than one circuit output. The portion of a circuit that affects exclusively one particular circuit output is usually termed a logic cone. The circuit 10' and reference circuit 10 represented in FIG. 1 each comprise only one such logic cone, the method described in the following also being applicable, without limitation, to circuit arrangements having a plurality of logic cones. In particular, it is to be noted at this point that the method described also does not require any analysis or identification of these logic cones.

The circuit 10' represented in FIG. 1 is equivalent, with regard to its function, to the reference circuit 10. In this case, it is possible for all elements of the circuit 10' to be uniquely assigned to respectively one element of the reference circuit 10. In particular, the circuit inputs 1', 2', 3' of the circuit 10' can be assigned to the circuit inputs 5, 6, 7 of the reference circuit 10, the circuit inputs 4', 5' of the circuit 10' can be assigned to the circuit inputs 8, 9 of the reference circuit 10, the circuit inputs 6', 7' of the circuit 10' can be assigned to the circuit inputs 3, 4 of the reference circuit 10, and the circuit inputs 8', 9' of the circuit 10' can be assigned to the circuit inputs 1, 2 of the reference circuit 10. Furthermore, the function blocks 11', 12' of the circuit 10' can be assigned to the function blocks 13, 14 of the reference circuit 10, the function blocks 13', 14' of the circuit 10' can be assigned to the function blocks 11, 12 of the reference circuit 10, and the function blocks 15', 16', 17' of the circuit 10' can be assigned to the function blocks 15, 16, 17 of the reference circuit 10. In the case of the aforementioned assignment of the circuit inputs, there is thus obtained for the circuit outputs 20' and 20 the same signal dependence on the signal inputs 1'-9' and 1-9 respectively, and the circuit 10' and the reference circuit 10 are equivalent with regard to their function.

Figure 2:
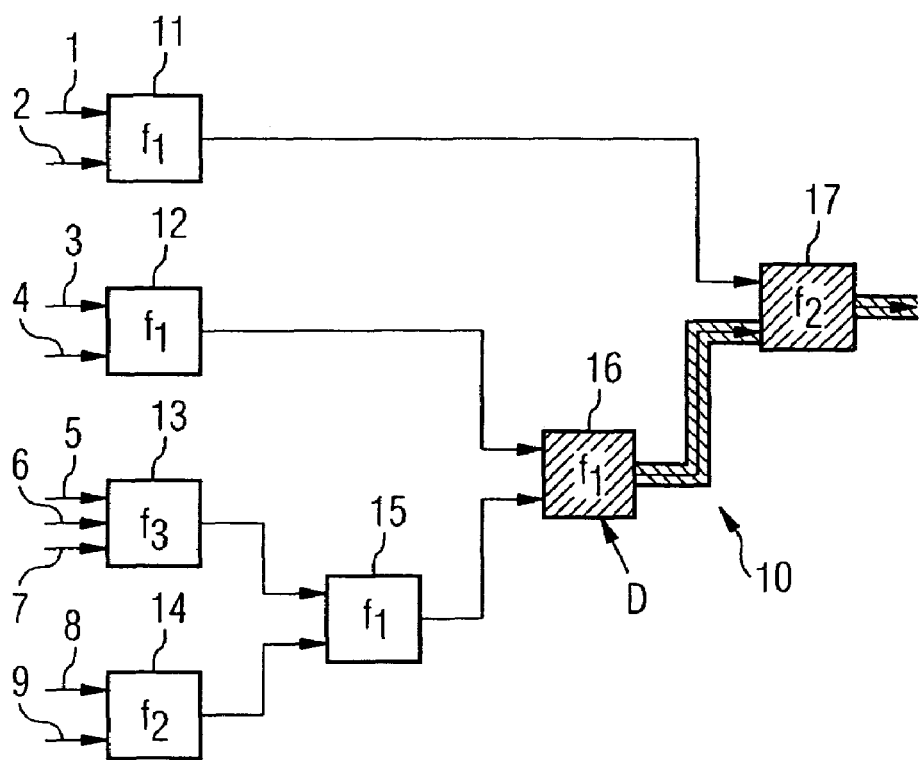
FIG. 2 shows the circuit and the reference circuit from FIG. 1, the circuit having a circuit deviation in respect of the reference circuit.
Figure 2:
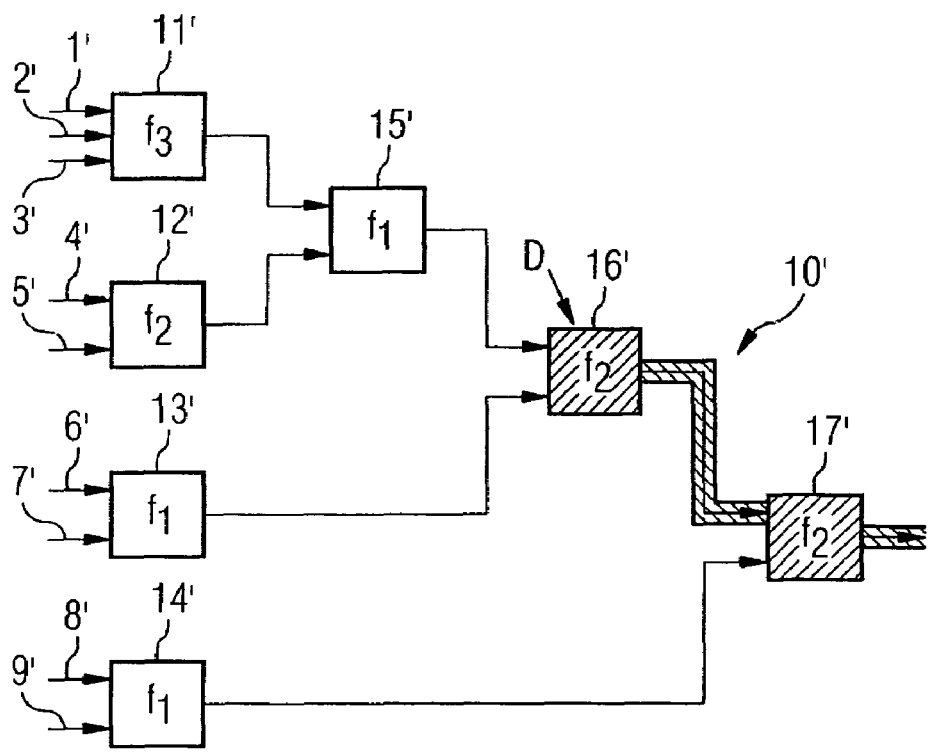

FIG. 2 shows the circuit 10' and the reference circuit 10 from FIG. 1, wherein, however, a deviation in respect of the reference circuit 10 has been inserted in the circuit 10'. This deviation consists in the function of the function block 16'. The result of this is that the function blocks 16', 17' no longer have the same signal dependence, at their respective outputs, as the function blocks 16, 17 of the reference circuit 10. The function blocks 16', 17' of the circuit 10' can therefore no longer be assigned to the function blocks 16, 17 of the reference circuit 10 on the basis of this signal dependence. For the rest of the function blocks 11'-15', 11-15, however, this assignment remains possible. For both the circuit 10' and the reference circuit 10, there thus results a set of assigned function blocks 11-17, 11'-17', and a set of non-assigned function blocks 11-17, 11'-17'.

If the assignment is effected, as described, on the basis of the signal dependence at the output of the function blocks 11-17, 11'-17', a deviating signal dependence on the signal inputs 1-9, 1'-9' also results in a deviating signal dependence at the function block 11-17, 11'-17' disposed downstream from this function block 11-17, 11'-17', this continuing in this manner towards the circuit output 20, 20'. The quantity of non-assigned function blocks 11-17, 11'17' will thus extend from a first non-assigned function block 11-17, 11'-17' towards the circuit output 20, 20', as shown in FIG. 2. In this case, the first non-assigned function block 11-17, 11'-17' has exclusively, disposed upstream in the signal flow, function blocks 11-17, 11'-17' for which it is possible to effect the assignment. The regions of the circuit 10' and of the reference circuit 10 which correspond to the non-assigned function blocks 11-17, 11'-17' are highlighted in FIG. 2. In FIG. 2, the highlighting is realized by hatching both of the function blocks 16, 17, 16', 17' and of the links downstream from them in the signal flow.

As can be seen from FIG. 2, the circuit deviation site is located in the region of the function block 11-17, 11'-17', disposed first in the signal flow, for which assignment has not been possible. In FIG. 2, this circuit deviation site is identified by a respective arrow D for the circuit 10' and the reference circuit 10.

Figure 3:
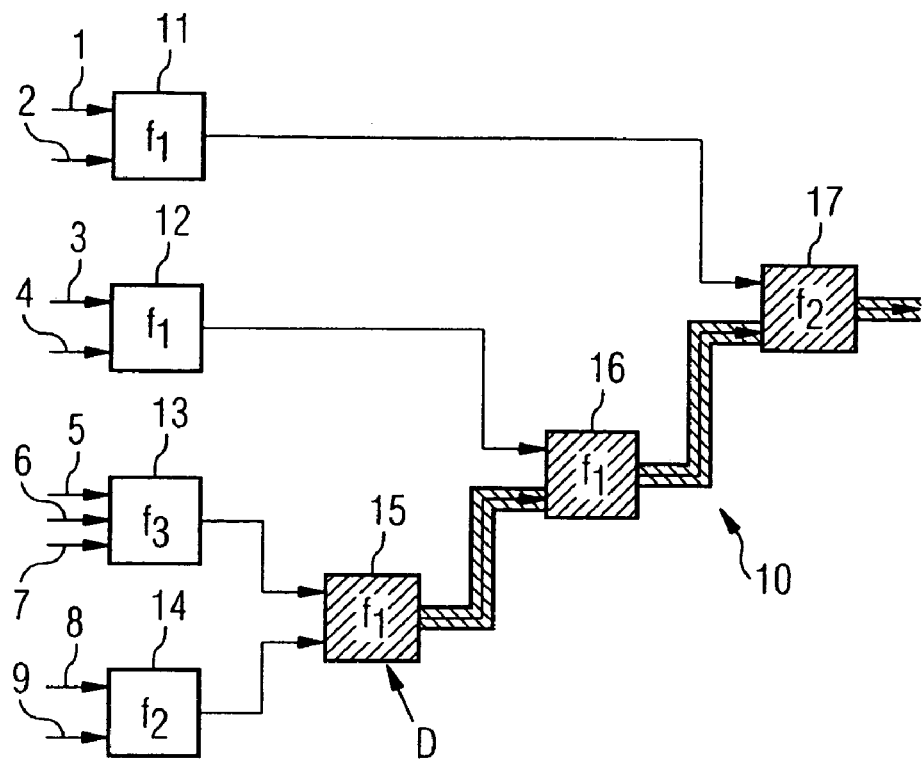
FIG. 3 shows the circuit and the reference circuit from FIG. 1, the circuit having, in respect of the reference circuit, a circuit deviation which differs from that of FIG. 2.
Figure 3:
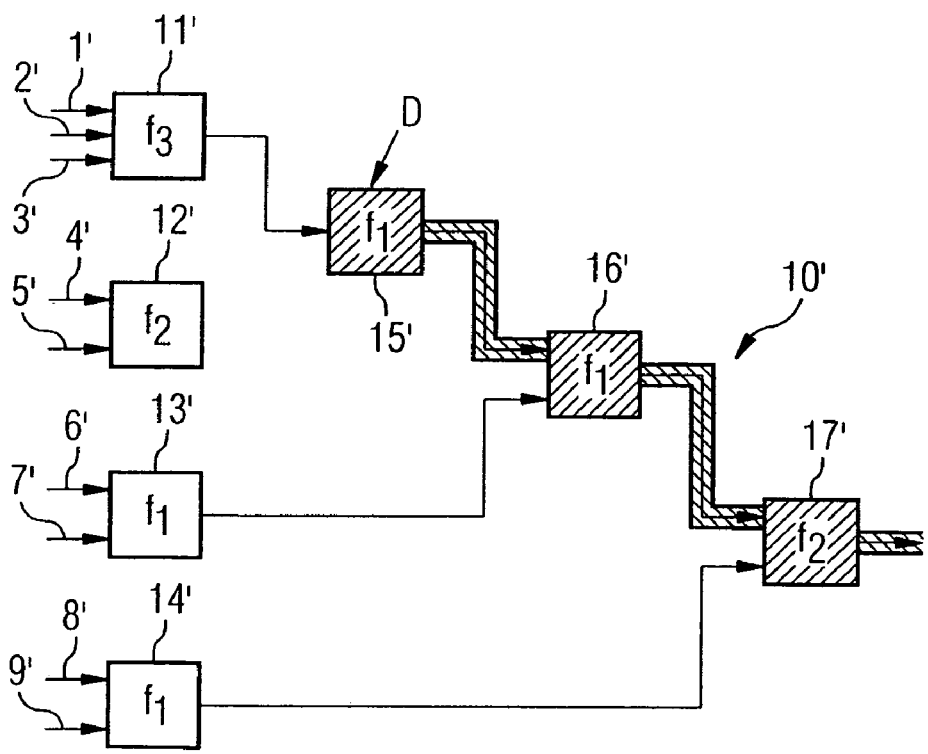

FIG. 3 shows a representation similar to that of FIG. 2, wherein, however, a circuit deviation different from the circuit deviation in FIG. 2 has been inserted in the circuit 10'. In this case, the circuit deviation consists in the absence of a link between the function block 12' and the function block 15'. Again, this results in a deviating signal dependence, this being initially at the output of the function block 15' of the circuit 10' in respect of the function block 15 of the reference circuit 10. The deviating signal dependence in respect of the circuit inputs 1-9, 1'-9' continues towards the circuit output 20, 20', as already described for FIG. 2, with the result that the assignment of the function blocks 15', 16', 17' of the circuit 10' to the function blocks 15, 16, 17 of the reference circuit 10, said assignment being based on the signal dependence, is not possible. The regions corresponding to the non-assigned function blocks are again highlighted by hatching, and the function block 15, 15' disposed first in the signal flow is identified by an arrow D. It can also be seen from FIG. 3 that the circuit deviation is located in the region of the function block 15', 15, for which assignment has not been possible.

Figure 4:
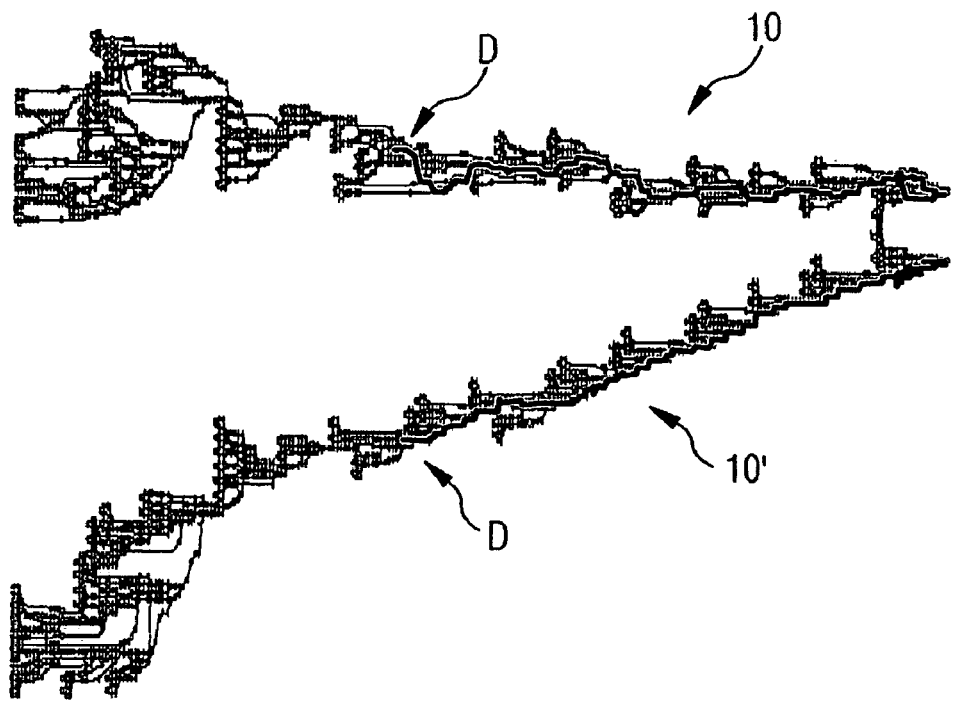
FIG. 4 shows, exemplarily, the signal-flow graph of a circuit and of a reference circuit respectively, in which signal-flow graphs there are represented, highlighted according to the invention, function blocks, and the links between them, for which it has not been possible to effect an assignment.

FIG. 4 shows, similarly to FIGS. 2 and 3, signal-flow graphs of a circuit 10' and of a reference circuit 10 respectively, in which regions corresponding to the non-assigned function blocks are highlighted. The circuit 10' and the reference circuit 10 of FIG. 4 again proceed from a common circuit design, but in this case a circuit arrangement is described which is substantially more complex than those in FIGS. 1-3. The function blocks 11-17, 11'-17' which are disposed first in the signal flow and for which assignment between the circuit 10' and the reference circuit 10 is not possible, are again identified by an arrow D. As can be seen from FIG. 4, the function blocks identified by the arrows D make it possible to locate the circuit deviation site.

Figure 5:
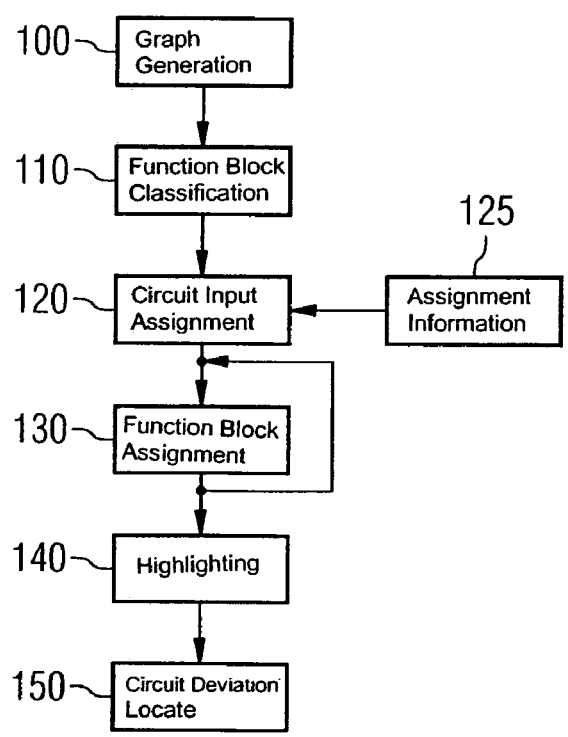
FIG. 5 shows a flow diagram which illustrates the sequence of the method according to the invention.

FIG. 5 describes a sequence of the method for locating circuit deviations on the basis of a flow diagram. The method is particularly suitable for implementation on a computer system.

In the signal-flow graph generation step 100, a respective signal-flow graph, of the type shown in FIGS. 1-4, is created for the circuit 10' and for the reference circuit 10. This is effected on the basis of circuit data in a computer-readable format, which may be, for example, one of the circuit description languages commonly used in circuit development. The signal-flow graphs of the circuit 10' and of the reference circuit 10 are represented in a manner enabling them to be viewed by a user, for example on a monitor screen of the computer system.

In the function-block classification step 110, the function blocks 11-17, 11'-17' of the circuit 10' and of the reference circuit 10 are classified with regard to the function that they perform in the circuit 10' and in the reference circuit 10 respectively. In this case, the function of the function blocks 11-7, 11'-17' is defined on the basis of the function that is performed in respect of the circuit inputs 1-9, 1'-9' of the circuit 10' and of the reference circuit 10 respectively. This means that function blocks which exhibit the same behaviour at their output or outputs, i.e. compute the same function, in dependence on signals at the circuit inputs of the circuit 10' and of the reference circuit 10 respectively, are assigned to the same class.

In the circuit-input assignment step 120, the initial assignment is effected between the function blocks 11'-17' of the circuit 10' and the function blocks 11-17 of the reference circuit 10 which are directly connected to the circuit inputs 1-9, 1'-9' of the circuit 10' and of the reference circuit 10. For this purpose, there is predefined assignment information 125, which assigns the circuit inputs 1'-9' of the circuit 10' to the circuit inputs 1-9 of the reference circuit 10. Such assignment information is usually already available, or can be created with little effort. Assignment between the function blocks 11'-17' of the circuit 10' and the function blocks 11-17 of the reference circuit 10 is then effected in that a check is respectively performed, for a pair consisting of a function block 11'-17' of the circuit 10' and a function block 11-17 of the circuit 10, to ascertain whether the function blocks are connected to circuit inputs 1-9, 1'-9' that are assigned to one another according to the assignment information 125, and whether the function blocks 11-17, 11'-17' have been assigned to the same class with regard to their function. If this is the case in both instances, the function block 11'-17' of the circuit 10' is assigned to the function block 11-17 of the reference circuit 10.

In the function-block assignment step 130, function blocks 11-17, 11'-17' that are disposed downstream in respect of the function blocks 11-17, 11'-17' assigned in step 120 are assigned. Again, pairs are formed, of function blocks 11'-17' of the circuit 10' and function blocks 11-17 of the reference circuit 10, each pair being checked for a match with regard to the set of function blocks 11-17, 11'-17', disposed upstream in the signal flow, that have already been assigned, and with regard to the assigned class. In the case of such a match, the respective function blocks 11-17, 11'-17' of the circuit 10' and of the reference circuit 10 are assigned to one another. The assignment step 130 is repeated iteratively until all function blocks 11-17, 11'-17' have been checked with regard to a possible assignment.

In the highlighting step 140, the non-assigned function blocks 11-17, 11'-17' are then highlighted in the signal-flow graph created in the signal-flow graph generation step 100. For this, the regions which in the representation correspond to the non-assigned function blocks 11-17, 11'-17' are colour-marked. In addition, the function blocks 11-17, 11'-17' for which an assignment has been effected are colour-marked with a colour which differs from the colour used for the non-assigned function blocks 11-17, 11'-17'. A multiplicity of colour combinations are conceivable in this case, for example, red and green, red and blue, etc. Alternatively, or additionally, other types of highlighting are conceivable, for example, hatching as shown in FIGS. 2 and 3, or flashing of the region to be highlighted on the monitor screen. As shown in FIGS. 2-4, the highlighting in this case includes both the function blocks 11-17, 11'-17' and the links respectively disposed downstream from the function blocks 11-17, 11'-17'.

The circuit-deviation locating step 150 ascertains the function blocks 11-17, 11'-17' which are disposed first in the signal flow, and for which no assignment has been possible. This means that the function blocks disposed immediately downstream from a boundary of the regions highlighted in step 140 are ascertained. This can, on the one hand, be effected optically, on the basis of the representation created in step 100 with the highlighting according to step 140, or it can also be effected automatically, on the basis of an appropriately designed algorithm. More precisely, this means that, of the non-assigned function blocks, there is identification of those function blocks which have upstream in the signal flow only function blocks 11-17, 11'-17' for which assignment has been possible in the steps 130 and 140, or which have no function block 11-17, 11'-17' upstream in the signal flow. Alternatively, this means that, of the non-assigned function blocks 11-17, 11'-17', there is identification of those function blocks which have upstream in the signal flow no function block 11-17, 11'-17' for which assignment has not been possible. As has been explained with reference to FIGS. 1-4, the circuit deviations or fault sites to be located are located in the region of function blocks 11-17, 11'-17' ascertained in this manner.

Figure 6:
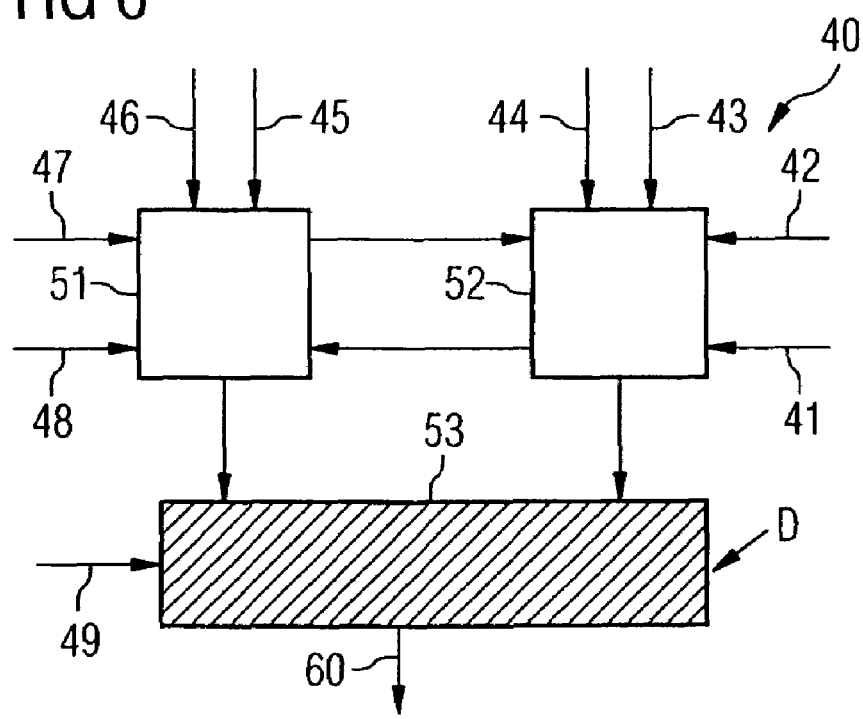
FIG. 6 shows a representation of a circuit according to a circuit description which differs from a signal-flow graph and in which an element, which comprises a non-assigned function block, is represented in highlighted form according to the invention.

FIG. 6 shows a representation 40 of a circuit according to a circuit description that differs from the signal-flow graphs of FIGS. 1-4. The representation 40 comprises circuit modules 51, 52, 53 which, according to their function, are provided with inputs and outputs. FIG. 6, in particular, is an alternative representation of the circuit 10' and of the reference circuit 10. The circuit representation 40 thus also has the same number of circuit inputs 41-49 and the same number of circuit outputs 60 as the circuit 10' and the reference circuit 10 of FIGS. 1-3. Unlike FIGS. 1-3, however, the functions of a plurality of the function blocks 11-17, 11'-17' are combined in respectively one of the circuit modules 51, 52, 53. The circuit description used in FIG. 6 differs from the signal-flow graphs of FIGS. 1-3 in that, within the circuit representation 40, the direction of the signal flow in respect of the circuit modules 51, 52, 53 cannot always be uniquely defined. In particular, there is a bidirectional signal link between the circuit modules 51 and 52, with the result that it is not possible definitively to ascertain which of the two circuit modules 51 and 52 is disposed upstream, and which is disposed downstream, in the signal flow in respect of the other. This is a result of combining the functions of a plurality of the function blocks 11-17, 11'-17' to form one of the circuit modules 51, 52, 53.

On the basis of the method previously described with reference to FIG. 5, however, it is also possible, in the circuit representation 40 of FIG. 6, to represent the assignment information obtained in the method and to highlight circuit deviations or fault sites, as illustrated in FIG. 6 by the hatching of the circuit module 53 and the arrow D. This is achieved in that there are highlighted in the circuit representation 40 those of the circuit modules 51, 52, 53 which comprise function blocks 11-17, 11'-17' for which it has not been possible to effect the assignment as described with reference to FIG. 5. The highlighting is indicated in FIG. 6 by the hatching of the circuit module 53 and the arrow D. In the implementation of the method on a computer system, this highlighting is preferably realized through colour-marking in the representation on a monitor screen of the computer system, in a manner similar to that already explained with reference to FIG. 5.

In the case of the method, explained above, for locating circuit deviations, it is thus possible to use various circuit representations of the type commonly used in computer-aided circuit development. The regions of functional deviations are highlighted in the said representations, and the detected circuit deviation sites or fault sites can be specifically identified. For the user, e.g. the circuit developer, convenient and effective orientation in the circuit is thus rendered possible.

Figure 7:
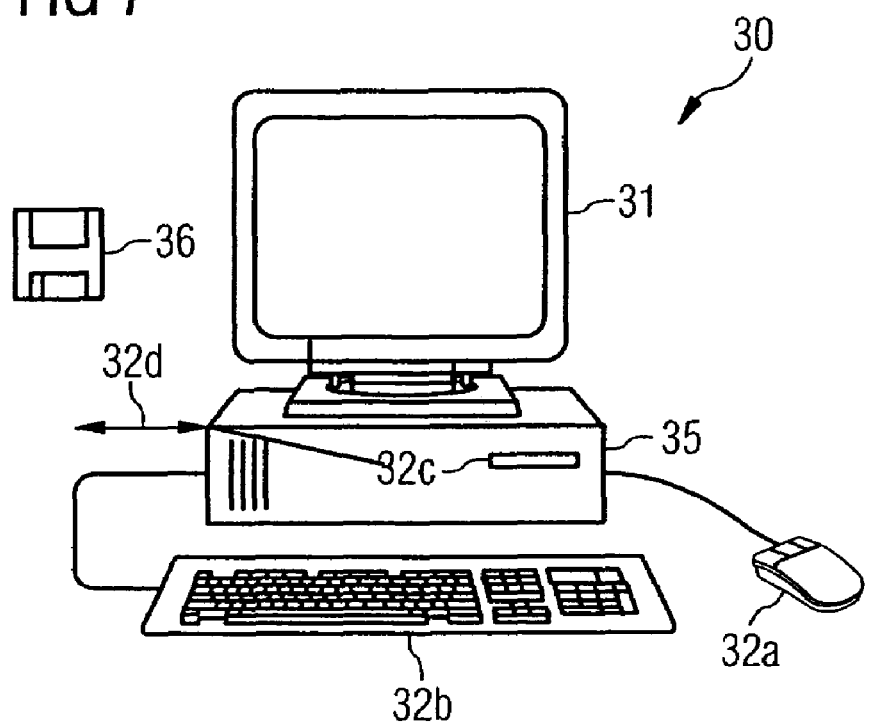
FIG. 7 shows an apparatus, according to the invention, for detecting circuit deviations, said apparatus being in the form of a computer system.

FIG. 7 shows, in schematic form, a computer system 30 which is configured by corresponding computer software for performing the previously described method for locating circuit deviations. The computer software is provided in the form of a program code on a data carrier 36. The computer system 30 has an image presentation means, in the form of a computer display screen 31, and input means 32a, 32b, 32c, 32d. Specifically, in this case, these are user operating means, in the form of a mouse 32a and a keyboard 32b, a read/write device 32c for data carriers, and a network interface 32d. However, a multiplicity of further input means are also conceivable.

In particular, the computer system 30 comprises data processing means 35 which are configured by the program code, executed on the computer system 30, for performing the previously described method. Circuits are represented, as provided for according to the method, on the computer display screen 31.

The previously described method was implemented on a currently usual computer system and evaluated with the aid of faulty circuits which had already been previously analyzed in a conventional manner. Results of the evaluation are summarized in the following table.

TABLE I

Evaluation Results

| No. | Size | Inputs | Non-assigned region | Deviation sites/ fault sites | Time [s] |
|---|---|---|---|---|---|
| 1 | 24418 | 117 | 21556 | 201 | 131 |
| 2 | 7068 | 192 | 5633 | 176 | 15 |
| 3 | 14960 | 496 | 262 | 2 | 1.8 |
| 4 | 80450 | 13401 | 8 | 4 | 5.6 |
| 5 | 36172 | 1143 | 494 | 16 | 3.6 |
| 6 | 6086 | 77 | 425 | 39 | 14.3 |
| 7 | 10607 | 830 | 5302 | 302 | 15.2 |
| 8 | 5768 | 102 | 188 | 5 | 0.7 |
| 9 | 4722 | 364 | 66 | 8 | 0.8 |
| 10 | 9454 | 438 | 5830 | 255 | 2.7 |
| 11 | 3496 | 465 | 374 | 19 | 0.5 |
| 12 | 26842 | 50 | 26010 | 119 | 43.3 |
| 13 | 10161 | 558 | 6139 | 514 | 12 |
| 14 | 492 | 30 | 176 | 24 | 0.1 |

In Table 1, the various circuits used for evaluation of the method each have a respective number. The size of the circuits is given by the number of function blocks or combinational circuits in respect of the circuit outputs examined. Also given is the number of inputs in relation to which the circuit outputs have a signal dependence. Given as the result in each case is the size of the non-assigned region ascertained by means of the method, i.e., of the function blocks or combinational circuits contained therein, the number of located deviation sites or fault sites, and the time required for performing the method. As evident from the results, it is possible, by means of the described method, to locate the circuit deviation sites or fault sites even in complex circuits having a multiplicity of function blocks, the time required for this corresponding approximately to that also required for performing a conventional equivalence comparison.

The described method is particularly suitable as a complement to an equivalence comparison of the circuit and of the reference circuit, in order to locate deviation sites or fault sites in the event of there being no equivalence. A preceding equivalence test of the circuit and of the reference test is not necessary, however, in order for the described method to be performed, and the method can also be applied directly to the circuit and the reference circuit without the previous performance of an equivalence comparison. If the method locates circuit deviations or fault sites, this simultaneously also shows the absence of equivalence of the circuits, so that, in these cases, it would be possible to dispense with performance of the equivalence comparison.

In the experimental evaluation of the method, it has additionally been found that locating of circuit deviation or fault sites remains possible even if the method is applied inaccurately or incorrectly, e.g., in the case of an incomplete predefined assignment of the circuit inputs.

The invention claimed is:

1. A method for locating circuit deviations between a circuit and a reference circuit, wherein the circuit and the reference circuit are describable by signal-flow graphs comprising a plurality of function blocks, wherein the function blocks are coupled in the signal-flow graphs by connecting an output of a function block which is upstream in the signal flow to an input of a function block which is downstream in the signal flow, and wherein a circuit input is respectively coupled to an input of one of the function blocks, and a circuit output is respectively coupled to an output of one of the function blocks, the method comprising the steps of:
assigning function blocks of the circuit to corresponding function blocks of the reference circuit, and
identifying those function blocks of the circuit for which it has not been possible to assign any function block of the reference circuit, and which have disposed upstream in the signal flow at least one function block to which it has been possible to assign a function block of the reference circuit.

2. The method according to claim 1 further comprising identifying those function blocks of the circuit for which it has not been possible to assign any function block of the reference circuit, and which have disposed upstream in the signal flow exclusively function blocks for which it has been possible to assign a function block of the reference circuit.

3. The method according to claim 1 further comprising identifying those function blocks of the circuit for which it has not been possible to assign any function block of the reference circuit, and which do not have any function block disposed upstream in the signal flow.

4. The method according to claim 1, wherein the signal-flow graph of the circuit is represented and, in the representation, a region corresponding to the non-assigned function blocks is marked in comparison with a region corresponding to the assigned function blocks.

5. The method according to claim 4, wherein the marking comprises a colour-marking of the assigned function blocks or of the coupling between the assigned function blocks, or both.

6. The method according to claim 4, wherein the marking comprises a colour-marking of the non-assigned function blocks or of the coupling between the non-assigned function blocks, or both.

7. The method according to claim 1, wherein assigning function blocks of the circuit to corresponding function blocks of the reference circuit comprises assigning iteratively on the basis of the quantity of the already assigned function blocks or circuit inputs that are respectively disposed upstream in the signal flow in respect of the assigned function blocks of the circuit and of the reference circuit, wherein an assignment of the circuit inputs of the circuit to the circuit inputs of the reference circuit is predefined.

8. The method according to claim 1, wherein assigning the function blocks of the circuit to corresponding function blocks of the reference circuit is carried out based on a respective function performed by the function blocks, assigned to one another, of the circuit and of the reference circuit.

9. The method according to claim 8, wherein the assigning function blocks of the circuit comprises respectively assigning to only one of the function blocks of the reference circuit, which function block performs a same function.

10. The method according to claim 1 further comprising classifying the function blocks of the circuit and the reference circuit in respect to the function which they perform in the circuit and in the reference circuit, respectively.

11. The method according to claim 10, wherein classifying the function blocks comprises classifying on the basis of functions defined in respect of the circuit inputs.

12. The method according to claim 1, wherein the circuit is represented according to a further circuit description, wherein elements of this representation, if they comprise at least one non-assigned function block, are represented in a marked form in comparison with elements which do not comprise any non-assigned function block.

13. The method according to claim 12, wherein the marking comprises an appropriate colour-marking of the elements of the representation.

14. The method according to claim 12, wherein the further circuit description corresponds to a hierarchy level which is higher in respect of the signal-flow graph of the circuit or of the reference circuit, or both, and wherein the elements of the further circuit description include higher-order circuit modules which respectively comprise at least one of the function blocks.

15. The method according to claim 1, wherein the method is executed symmetrically in respect of the circuit and the reference circuit, and wherein procedural steps defined for the circuit are also performed for the reference circuit and the corresponding procedural sequence for the reference circuit is obtained by exchanging the circuit and the reference circuit.

16. A computer readable medium comprising a program code embedded thereon suitable for use with a computer system and configured to execute the method according to claim 1.

17. An apparatus for locating circuit deviations between a circuit and a reference circuit, wherein the circuit and the reference circuit are describable by signal-flow graphs comprising function blocks, wherein the function blocks are coupled to one another, by connecting an output of a function block which is upstream in the signal flow to an input of a function block which is downstream in the signal flow, and wherein a circuit input is respectively coupled to an input of one of the function blocks, and a circuit output is respectively coupled to an output of one of the function blocks, and further comprising input means for inputting circuit data which describe the circuit and the reference circuit, and data processing means, which are designed, through processing of the circuit data, to perform the following functions:
  a) assignment of function blocks of the circuit to corresponding function blocks of the reference circuit, and
  b) identification of those function blocks of the circuit to which it has not been possible to assign any function block of the reference circuit, and which have upstream in the signal flow at least one function block to which it has been possible to assign a function block of the reference circuit.

* * * * *